(12) United States Patent
Kroener

(10) Patent No.: US 10,017,870 B2
(45) Date of Patent: Jul. 10, 2018

(54) METHOD FOR FABRICATING A HEAT SINK, AND HEAT SINK

(71) Applicant: Infineon Technologies AG, Neubiberg (DE)

(72) Inventor: Friedrich Kroener, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 409 days.

(21) Appl. No.: 14/667,767

(22) Filed: Mar. 25, 2015

(65) Prior Publication Data

US 2015/0197869 A1    Jul. 16, 2015

Related U.S. Application Data

(62) Division of application No. 13/591,239, filed on Aug. 22, 2012, now Pat. No. 9,017,539.

(51) Int. Cl.
  *C25D 5/54*   (2006.01)
  *C25D 5/02*   (2006.01)
  *B82Y 30/00*  (2011.01)
  *C25D 5/10*   (2006.01)
  *H01L 23/373* (2006.01)
  *C25D 7/12*   (2006.01)
  *C25D 5/14*   (2006.01)
  *C25D 5/50*   (2006.01)
  *F28F 21/02*  (2006.01)
  (Continued)

(52) U.S. Cl.
  CPC .............. *C25D 5/022* (2013.01); *B82Y 30/00* (2013.01); *C25D 5/10* (2013.01); *C25D 5/14* (2013.01); *C25D 5/50* (2013.01); *C25D 5/54* (2013.01); *C25D 7/12* (2013.01); *D06M 10/06* (2013.01); *D06M 11/83* (2013.01); *F28F 21/02* (2013.01); *F28F 21/085* (2013.01); *H01L 21/4871* (2013.01); *H01L 23/373* (2013.01); *H01L 23/3733* (2013.01); *H01L 24/83* (2013.01); *C25D 5/18* (2013.01); *D06M 2101/40* (2013.01); *F28F 3/02* (2013.01); *F28F 21/00* (2013.01); *H01L 2224/8384* (2013.01); *H01L 2224/83801* (2013.01); *H01L 2924/00* (2013.01); *H01L 2924/0002* (2013.01);
  (Continued)

(58) Field of Classification Search
  CPC .................................. C25D 5/54; C25D 7/00
  USPC ......................................... 205/159, 160, 161
  See application file for complete search history.

(56) References Cited

U.S. PATENT DOCUMENTS 3,550,247 A   12/1970  Evans
5,171,419 A   12/1992  Wheeler et al.
(Continued)

FOREIGN PATENT DOCUMENTS

CN   1210913 A   3/1999
CN   1635950 A   7/2005
(Continued)

*Primary Examiner* — Edna Wong
(74) *Attorney, Agent, or Firm* — Viering, Jentschura & Partner mbB

(57) ABSTRACT

A method for fabricating a heat sink including providing a carbon metal composite having a plurality of metal-coated carbon fibers and a plurality of openings, the openings leading from a first side of the carbon metal composite to a second side of the carbon metal composite, disposing the carbon metal composite over a semiconductor element such that the first side of the carbon metal composite faces the semiconductor element, and bonding the carbon metal composite to the semiconductor element by means of an electroplating process, wherein a metal electrolyte is supplied to an interface between the carbon metal composite and the semiconductor element via the plurality of openings.

12 Claims, 4 Drawing Sheets

(51) Int. Cl.
  *F28F 21/08* (2006.01)
  *H01L 21/48* (2006.01)
  *H01L 23/00* (2006.01)
  *D06M 10/06* (2006.01)
  *D06M 11/83* (2006.01)
  *D06M 101/40* (2006.01)
  *C25D 5/18* (2006.01)
  *F28F 3/02* (2006.01)
  *F28F 21/00* (2006.01)

(52) U.S. Cl.
  CPC ............ *H01L 2924/01006* (2013.01); *H01L 2924/01028* (2013.01); *H01L 2924/01029* (2013.01); *H01L 2924/13055* (2013.01)

(56) References Cited

U.S. PATENT DOCUMENTS

| | | | |
|---|---|---|---|
| 6,404,070 B1 * | 6/2002 | Higashi | D03D 15/0088 257/778 |
| 6,469,381 B1 * | 10/2002 | Houle | H01L 21/4882 257/704 |
| 8,357,881 B2 | 1/2013 | Feng et al. | |
| 9,017,539 B2 * | 4/2015 | Kroener | F28F 21/085 205/118 |
| 9,101,981 B2 | 8/2015 | Aoki et al. | |
| 2005/0087864 A1 * | 4/2005 | Yang | H01L 23/3128 257/720 |
| 2005/0093121 A1 * | 5/2005 | Chen | H01L 23/4334 257/678 |
| 2005/0260909 A1 | 11/2005 | Hirahara | |
| 2011/0036828 A1 | 2/2011 | Feng et al. | |
| 2012/0189839 A1 | 7/2012 | Aoki et al. | |

FOREIGN PATENT DOCUMENTS

| | | |
|---|---|---|
| CN | 1685104 A | 10/2005 |
| CN | 201010743 Y | 1/2008 |
| CN | 101998706 A | 3/2011 |
| CN | 102615278 A | 8/2012 |
| EP | 0909845 A1 | 4/1999 |
| EP | 0909845 B1 | 1/2010 |
| JP | H01308688 A | 12/1989 |
| JP | 2000022055 A | 1/2000 |
| WO | 0226479 A2 | 4/2002 |

* cited by examiner

METHOD FOR FABRICATING A HEAT SINK, AND HEAT SINK

RELATED APPLICATION(S)

The present application is a divisional of U.S. patent application Ser. No. 13/591,239, filed Aug. 22, 2012, now U.S. Pat. No. 9,017,539, the contents of which are incorporated herein by reference in its entirety for all purposes.

BACKGROUND

Various embodiments relate generally to a method for fabricating a heat sink, and a heat sink.

Electronic devices, e.g. power electronic devices, generally produce heat during operation. It may be desirable to provide suitable heat sinks to dissipate the heat produced by the electronic devices.

SUMMARY

A method for fabricating a heat sink in accordance with an embodiment may include: providing a carbon fiber fabric having a plurality of carbon fibers and a plurality of openings, the openings leading from a first side of the carbon fiber fabric to a second side of the carbon fiber fabric; and electroplating the carbon fiber fabric with metal (e.g. copper), wherein the metal (e.g. copper) is deposited with a higher rate at the first side of the carbon fiber fabric than at the second side of the carbon fiber fabric.

A method for fabricating a heat sink in accordance with another embodiment may include: providing a carbon metal composite (e.g. carbon copper composite) having a plurality of metal-coated carbon fibers (e.g. copper-coated carbon fibers) and a plurality of openings, the openings leading from a first side of the carbon metal composite to a second side of the carbon metal composite; disposing the carbon metal composite over a semiconductor element such that the first side of the carbon metal composite faces the semiconductor element; and bonding the carbon metal composite to the semiconductor element by means of an electroplating process, wherein metal electrolyte (e.g. copper electrolyte) is supplied to an interface between the first side of the carbon metal composite and the semiconductor element via the plurality of openings.

A method for fabricating a heat sink in accordance with another embodiment may include: providing a carbon fiber fabric having a plurality of carbon fibers and a plurality of openings located at cross-points of the fabric; depositing metal (e.g. copper) electrolytically onto the carbon fibers to form a carbon metal composite (e.g. carbon copper composite), wherein the metal is deposited such that at least some of the plurality of openings remain at least partially free from metal and form at least one contiguous path leading from a first side to a second side of the carbon metal composite; placing the carbon metal composite adjacent to a semiconductor element with the first side of the carbon metal composite facing the semiconductor element; and filling the at least one contiguous path electrolytically with metal (e.g. copper) to attach the carbon metal composite to the semiconductor element.

A method for fabricating a heat sink in accordance with another embodiment may include: pre-galvanizing a carbon fiber fabric with metal (e.g. copper) to form a carbon metal composite (e.g. carbon copper composite) having a plurality of openings leading from a first side of the carbon metal composite to the second side of the carbon metal composite; and bonding the carbon metal composite with the first side to a chip or wafer by means of a galvanic process, wherein metal electrolyte (e.g. copper electrolyte) is supplied from the second side to an interface between the chip or wafer and the first side via the plurality of openings.

A heat sink in accordance with another embodiment may include: a carbon fiber fabric galvanized with metal (e.g. copper) and having a plurality of openings leading from a first side of the fabric to a second side of the fabric, wherein the openings are narrower at the first side than at the second side of the fabric.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which.

DESCRIPTION

Figure 1:
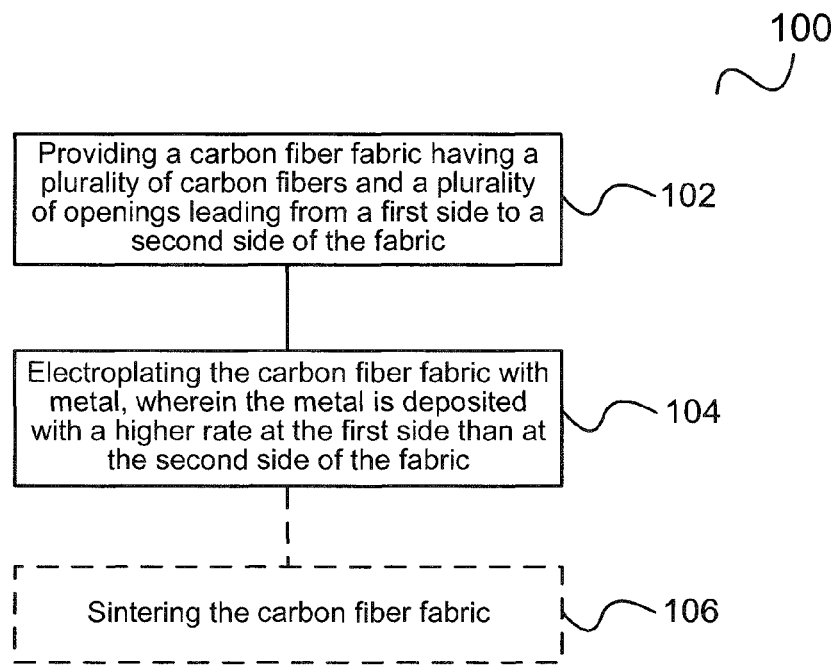
FIG. 1 shows a method for fabricating a heat sink in accordance with an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Electronic devices, e.g. power electronic devices, generally produce heat during operation. It may be desirable to provide suitable heat sinks to dissipate the heat produced by the electronic devices. A heat sink for a power electronic device or component (e.g. a high power module such as an IGBT (insulated gate bipolar transistor) module) may, for example, mean the intermediate storage of a pulse-like heat loss of a power switch, which may be caused, for example, by a short-circuit-like current upon switch-on of a light bulb during the time the filament of the bulb is cold.

A heat sink may preferably have one or more (e.g. all) of the following properties: an electrical conductivity substantially higher than that of silicon, a thermal conductivity at least equal to that of silicon, a specific heat substantially higher than that of silicon.

Pure copper meets the aforementioned requirements very well. However, the difference between the coefficient of thermal expansion (CTE) of copper ($CTE_{Cu} \approx 16.5*10^{-6}\,K^{-1}$) and that of silicon ($CTE_{Si} \approx 2.6*10^{-6}\,K^{-1}$) is rather large so that thermal stress generated in a thin silicon chip and at the silicon-copper interface between the chip and the heat sink due to the CTE difference may be difficult to control.

A composite of carbon fibers and copper (in the following referred to as CCu) has been proposed as alternative heat sink material. Though the thermal conductivity of CCu is not significantly higher than that of silicon, CCu yields a CTE of about $4*10^{-6}$ K$^{-1}$ to $6*10^{-6}$ K$^{-1}$, which is much closer to the CTE of silicon ($2.6*10^{-6}$ K$^{-1}$) compared to the CTE of pure copper ($16.5*10^{-6}$ K$^{-1}$). Therefore, the use of CCu as heat sink material may greatly reduce thermal stress and chip bending. Furthermore, the other above-mentioned requirements for a heat sink may be very well fulfilled by CCu.

Conventionally, CCu has been used as an alternative to so-called lead frames or other substrates, onto which silicon chips are to be soldered, such as DCB (direct copper bonded) substrates. To begin with, this may result in the same problems occurring also when soldering chips onto substrates made of pure copper: e.g. voids, blisters, and a non-ideal thermal coupling to the silicon due to possible metallic barriers or due to a thick layer of soldering metal (e.g. tin solder). The extent of those problems may be reduced, though, due to the CTE of CCu being much closer to the CTE of silicon. However, in any case metallic barrier layers may be needed for a soldering process, wherein the thermal properties of metals, which are suitable for soldering, may be unfavorable.

FIG. 1 shows a method 100 for fabricating a heat sink in accordance with an embodiment.

As shown in 102, a carbon fiber fabric may be provided.

The carbon fiber fabric may have a plurality of carbon fibers. In accordance with one or more embodiments, one or more (e.g. all) of the carbon fibers may include graphite. The number of carbon fibers in the carbon fiber fabric may be arbitrary, in general. The carbon fibers may, for example, be arranged in bundles, wherein each bundle may have one or a plurality of carbon fibers. The number of carbon fibers per bundle may be arbitrary, in general, and may be the same for each bundle or may be different for different bundles. The bundles may cross each other.

In accordance with an embodiment, at least one (e.g. a plurality, e.g. all) of the carbon fibers may have a length in the millimeter range, for example a few millimeters. Other, e.g. higher, values may be possible as well in accordance with other embodiments.

In accordance with another embodiment, at least one (e.g. a plurality, e.g. all) of the carbon fibers may have a diameter in the range from about 1 μm to about 50 μm. Other values may be possible as well in accordance with other embodiments.

The carbon fiber fabric may further have a plurality of openings, also referred to as voids herein. The openings may lead from a first side of the carbon fiber fabric to a second side of the carbon fiber fabric. In other words, the openings may form at least one contiguous path from the first side to the second side of the fabric. The first side and the second side of the fabric may, for example, be opposite sides of the fabric. The first side may, for example, be an upper side of the fabric and the second side may, for example, be a lower side of the fabric. Alternatively, the first side may, for example, be a lower side of the fabric and the second side may, for example, be an upper side of the fabric.

In accordance with an embodiment, the openings (voids) may be located at cross-points of the carbon fiber fabric, for example between two or more bundles of carbon fibers in accordance with some embodiments, for example at locations where two or more bundles cross each other in accordance with some embodiments.

In accordance with another embodiment, the openings (voids) may have a diameter in the range from about 10 μm to about 100 μm. Other values may be possible as well in accordance with other embodiments. In this context, the "diameter" of an opening may, for example, refer to the diameter of an opening's cross-section parallel to the first side and/or second side of the carbon fiber fabric.

As shown in 104, the carbon fiber fabric, or the carbon fibers, may be electroplated with a metal. The metal may include or may be copper, although other metals or metal alloys may be possible as well, e.g. gold, silver, or others. In other words, metal (e.g. copper) may be deposited over the carbon fiber fabric, e.g. over the carbon fibers, by means of electrolytic deposition. In still other words, the carbon fiber fabric, or the carbon fibers, may be pre-galvanized with metal (e.g. copper).

The term "over" as used herein in expressions such as "Y is deposited over X", "Y is disposed over X", "Y is formed over X", "Y is arranged over X", etc., may be understood to include both the case where "Y" is disposed or formed on "X" with direct physical and/or electrical contact, and the case where one or more elements (structures, layers, etc.) may be disposed or formed between "X" and "Y".

The expression "X is electroplated with Y" as used herein may be understood to include both the case where "Y" is deposited on "X" (by means of electroplating) with direct physical and/or electrical contact between "X" and "Y", and the case where one or more elements or layers may be disposed or formed between "X" and "Y". For example, the expression "the carbon fiber fabric is electroplated with copper" may be understood to include both the case where copper is deposited directly on the carbon fibers, and the case where one or more layers may be disposed between the carbon fibers and the copper.

The metal (e.g. copper) may be deposited with a higher rate at the first side than at the second side of the carbon fiber fabric. Thus, the openings may become narrower at the first side than at the second side of the carbon fiber fabric. In other words, the carbon fiber fabric may be plated asymmetrically with metal (e.g. copper). In still other words, the carbon fiber fabric may be pre-galvanized with metal (e.g. copper) in such a way that more metal (e.g. copper) grows on the first side of the carbon fiber fabric than on the second side of the carbon fiber fabric. In still other words, the metal (e.g. copper) may be deposited such that at the first side of the fabric the carbon fibers may be coated with a thicker metal layer (e.g. copper layer) than at the second side. This may, for example, be achieved by establishing a diffusion-controlled plating process, for example using a short distance between workpiece (i.e. carbon fiber fabric) and anode, and a relatively diluted electrolyte.

In accordance with another embodiment, the carbon fiber fabric may be electroplated with a metal that forms at least one common phase with carbon and at least one common phase with copper, and the carbon fiber fabric and the metal may be annealed (in other words, heated or tempered) after electroplating the carbon fiber fabric with the metal and before electroplating the carbon fiber fabric with copper.

The term "phase", as used herein, may be understood to refer to a solid state phase, and the term "common phase" may be understood to refer to a stoichiometrically determined solid state phase of a binary system (in other words, a system of two components), as may be indicated in a corresponding phase diagram of the binary system. For example, the term "common phase of X and Y" may be understood to refer to any stoichiometrically determined solid state phase in the phase diagram corresponding to the binary system X-Y.

In accordance with another embodiment, the metal may be chromium (Cr) or manganese (Mn).

In accordance with another embodiment, the carbon fiber fabric may be electroplated with a first metal layer containing or consisting of a metal that forms at least one common phase with carbon and at least one common phase with nickel, the carbon fiber fabric may be electroplated with a second metal layer after electroplating the carbon fiber fabric with the first metal layer, the second metal layer containing or consisting of nickel, and the carbon fiber fabric, the first metal layer and the second metal layer may be annealed after electroplating the carbon fiber fabric with the second metal layer and before electroplating the carbon fiber fabric with copper.

In accordance with another embodiment, the metal of the first metal layer may be chromium (Cr) or manganese (Mn).

Thus, in accordance with some embodiments, a metal layer, or a first metal layer and a second metal layer, may be deposited over the carbon fibers and annealed. The metal layer, or the first metal layer and the second metal layer, may serve as adhesion layer or adhesion layer stack to enable or improve adhesion between the carbon fibers and the copper.

In accordance with another embodiment, the metal layer, or the first metal layer and/or the second metal layer, may be deposited such that they have a layer thickness that is smaller than the diameter of the carbon fibers, for example substantially smaller than the diameter of the carbon fibers, for example in the range from about 10 nm to about 500 nm. Other values may be possible as well in accordance with other embodiments.

In accordance with another embodiment, electroplating the metal layer, or the first metal layer and/or second metal layer, may be effected by pulsed electroplating (also referred to as pulse electroplating, pulse galvanic, or galvanic pulse deposition). The term "pulsed electroplating" as used herein may be understood to refer to an electroplating (electrolytic deposition) technique, in which a plating current may be supplied in one or more pulses of predeterminable duration and/or height.

In accordance with other embodiments, electroplating the metal layer, or the first metal layer and/or second metal layer, may be effected by means of other suitable electroplating techniques.

Annealing the carbon fiber fabric and the metal layer(s) may serve to form common phases at interfaces between the carbon and the metal layers and/or interfaces between the metal layers.

As shown in 106, the carbon fiber fabric may be sintered in accordance with another embodiment. In other words, the carbon fiber fabric may be subjected to high temperature and high pressure.

The sintering is an optional process, which may be carried out after electroplating the carbon fiber fabric with metal (e.g. copper).

In accordance with another embodiment, the carbon fiber fabric may be disposed over a semiconductor element after electroplating the carbon fiber fabric with metal (e.g. copper) (and possibly after sintering the carbon fiber fabric), such that the first side of the carbon fiber fabric faces the semiconductor element; and the carbon fiber fabric may be bonded to the semiconductor element by means of an electroplating process, wherein metal electrolyte (e.g., copper electrolyte) is supplied to an interface between the first side of the carbon fiber fabric and the semiconductor element via the plurality of openings.

The semiconductor element may, for example, include or be a chip or wafer, for example a silicon chip or wafer. The semiconductor element, e.g. chip or wafer, may contain or consist of other semiconductor materials than silicon, including compound semiconductors, in accordance with other embodiments. The carbon fiber fabric may, for example, be bonded to a back side surface of the chip or wafer.

Illustratively, the pre-galvanized carbon fiber fabric may be galvanically bonded or attached to the semiconductor element by means of galvanic formation of a metal layer (e.g. copper layer) between the carbon fiber fabric and the semiconductor element. In this context, the at least one contiguous path (formed by the openings in the fabric) leading from the first side to the second side of the carbon fiber fabric may serve to supply or transport metal electrolyte (e.g. copper electrolyte) to an interface between the first side of the carbon fiber fabric and the semiconductor element. Thus, the electrolyte may come into contact with the interface between the fabric and the semiconductor element at a plurality or multiplicity of locations.

In accordance with another embodiment, bonding the carbon fiber fabric to the semiconductor element by means of the electroplating process may include filling a first portion of the plurality of openings with metal (e.g. copper), and the semiconductor element and the carbon fiber fabric may be soldered to a carrier, wherein a remaining portion of the plurality of openings may be filled with soldering metal (e.g. tin solder).

The carrier may, for example, be a lead frame.

Figure 2:
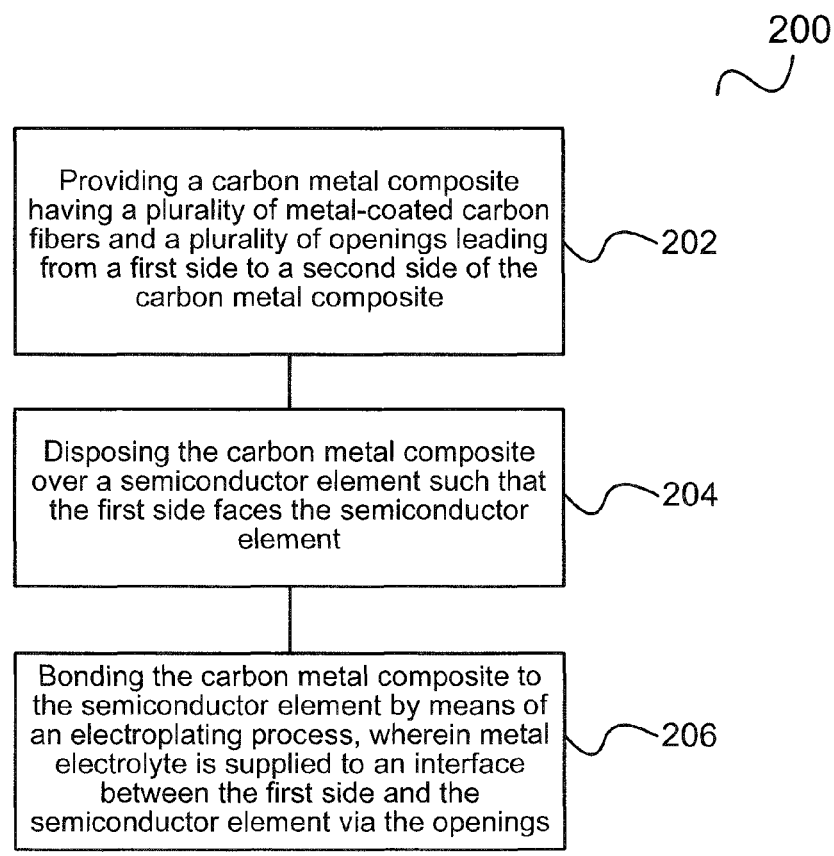
FIG. 2 shows a method for fabricating a heat sink in accordance with another embodiment.

FIG. 2 shows a method 200 for fabricating a heat sink in accordance with another embodiment.

As shown in 202, a carbon metal composite, for example a carbon copper composite, may be provided. The carbon metal composite (e.g. carbon copper composite) may have a plurality of metal-coated carbon fibers (e.g. copper-coated carbon fibers).

The carbon metal composite may further have a plurality of openings (herein also referred to as voids) leading from a first side of the carbon metal composite to a second side of the carbon metal composite.

In accordance with an embodiment, the openings may be narrower at the first side of the carbon metal composite than at the second side of the carbon metal composite. In other words, a diameter of the openings may be smaller at the first side than at the second side of the carbon metal composite.

As shown in 204, the carbon metal composite may be disposed over a semiconductor element such that the first side of the carbon metal composite faces the semiconductor element.

As shown in 206, the carbon metal composite (e.g. carbon copper composite) may be bonded to the semiconductor element by means of an electroplating process, wherein metal electrolyte (e.g. copper electrolyte) is supplied to an interface between the first side of the carbon metal composite and the semiconductor element via the plurality of openings.

The openings may form at least one contiguous path from the first side of the carbon metal composite to the second side of the carbon metal composite. The first side and the second side of the carbon metal composite may, for example, be opposite sides of the composite.

In accordance with another embodiment, the semiconductor element may include or may be a chip or wafer, e.g. a silicon chip or wafer. The semiconductor element, e.g. chip or wafer, may contain or consist of other semiconductor materials than silicon, including compound semiconductors, in accordance with other embodiments.

In accordance with another embodiment, the carbon metal composite may be disposed over a back side surface of the chip or wafer, and may be bonded to the back side surface of the chip or wafer.

In accordance with another embodiment, providing the carbon metal composite may include: providing a carbon fiber fabric having a plurality of carbon fibers and a plurality of openings (herein also referred to as voids), the openings leading from a first side of the carbon fiber fabric to a second side of the carbon fiber fabric; and electroplating the carbon fiber fabric with metal (e.g. copper).

The first side of the carbon fiber fabric may correspond to the first side of the carbon metal composite, and the second side of the carbon fiber fabric may correspond to the second side of the carbon metal composite.

The number of carbon fibers in the carbon fiber fabric may be arbitrary, in general. The carbon fibers may, for example, be arranged in bundles, wherein each bundle may have one or a plurality of carbon fibers. The number of carbon fibers per bundle may be arbitrary, in general, and may be the same for each bundle or may be different for different bundles. In accordance with one or more embodiments, one or more (e.g. all) of the carbon fibers may include graphite.

In accordance with an embodiment, at least one (e.g. a plurality, e.g. all) of the carbon fibers may have a length in the millimeter range, for example a few millimeters. Other, e.g. higher, values may be possible as well in accordance with other embodiments.

In accordance with another embodiment, at least one (e.g. a plurality, e.g. all) of the carbon fibers may have a diameter in the range from about 1 µm to about 50 µm. Other values may be possible as well in accordance with other embodiments.

In accordance with another embodiment, the openings (voids) of the carbon fiber fabric may be located at crosspoints of the carbon fiber fabric, for example between two or more bundles of carbon fibers in accordance with some embodiments, for example at locations where two or more bundles cross each other in accordance with some embodiments.

In accordance with another embodiment, the openings (voids) of the carbon fiber fabric and/or the openings of the carbon metal composite may have a diameter in the range from about 10 µm to about 100 µm. Other values may be possible as well in accordance with other embodiments. In this context, the "diameter" of an opening may, for example, refer to the diameter of an opening's cross-section parallel to the first side and/or second side of the carbon fiber fabric or carbon metal composite.

In accordance with another embodiment, electroplating the carbon fiber fabric with metal (e.g. copper) may be carried out such that the metal is deposited with a higher rate at the first side of the carbon fiber fabric than at the second side of the carbon fiber fabric. Thus, the openings may become narrower at the first side than at the second side of the carbon fiber fabric. In other words, the carbon fiber fabric may be plated asymmetrically with metal. In still other words, the carbon fiber fabric may be pre-galvanized with metal in such a way that more metal grows on the first side of the carbon fiber fabric than on the second side of the carbon fiber fabric. In still other words, the metal may be deposited such that at the first side of the fabric the carbon fibers may be coated with a thicker metal layer than at the second side. This may, for example, be achieved by establishing a diffusion-controlled plating process, for example using a short distance between workpiece (i.e. carbon fiber fabric) and anode, and a relatively diluted electrolyte.

In accordance with another embodiment, providing the carbon copper composite may include: electroplating the carbon fiber fabric with a metal that forms at least one common phase with carbon and at least one common phase with copper; and annealing (in other words, heating or tempering) the carbon fiber fabric and the metal after electroplating the carbon fiber fabric with the metal and before electroplating the carbon fiber fabric with copper. The metal may, for example, be chromium (Cr) or manganese (Mn).

In accordance with another embodiment, providing the carbon copper composite may include: electroplating the carbon fiber fabric with a first metal layer containing or consisting of a metal that forms at least one common phase with carbon and at least one common phase with nickel; electroplating the carbon fiber fabric with a second metal layer after electroplating the carbon fiber fabric with the first metal layer, the second metal layer containing or consisting of nickel; and annealing the carbon fiber fabric, the first metal layer and the second metal layer after electroplating the carbon fiber fabric with the second metal layer and before electroplating the carbon fiber fabric with copper. The metal of the first metal layer may, for example, be chromium (Cr) or manganese (Mn).

In accordance with another embodiment, providing the carbon metal composite (e.g. carbon copper composite) may include: sintering the carbon fiber fabric after electroplating the carbon fiber fabric with metal (e.g. copper).

In accordance with another embodiment, bonding the carbon metal composite (e.g. carbon copper composite) to the semiconductor element may include: filling a first portion of the openings of the carbon metal composite with metal (e.g. copper), and the semiconductor element and the carbon metal composite may be soldered to a carrier (e.g. a lead frame) after bonding the carbon metal composite to the semiconductor element, wherein a remaining portion of the openings of the carbon metal composite may be filled with soldering metal (e.g. tin).

Figure 3:
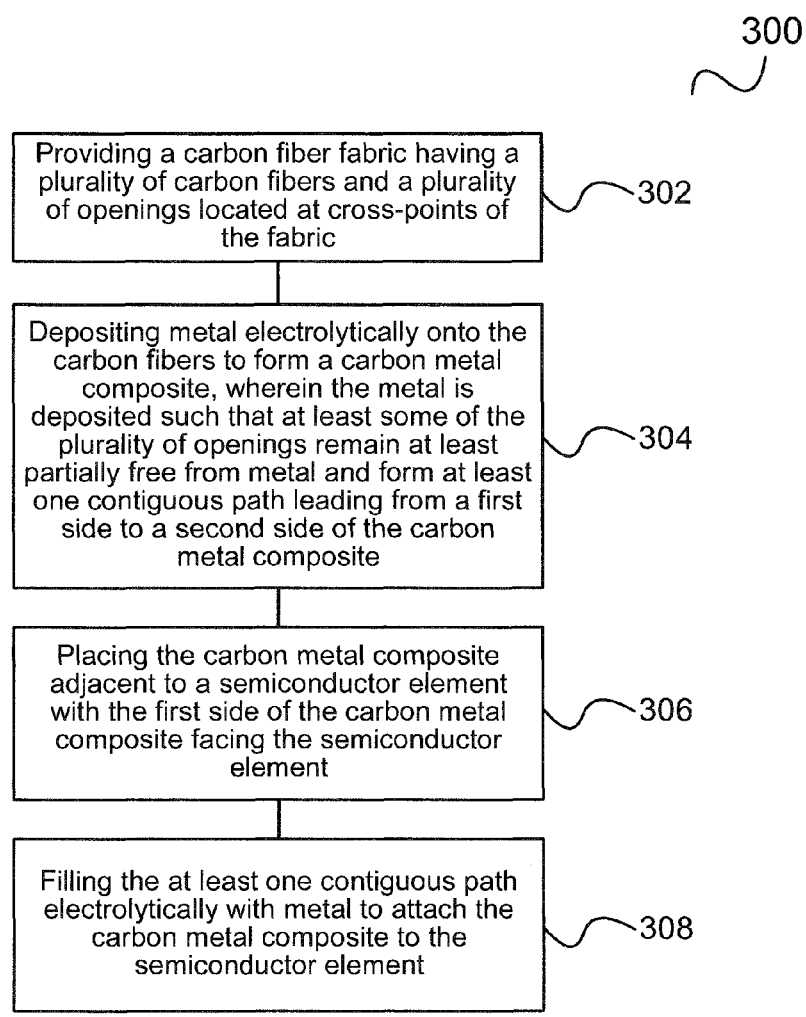
FIG. 3 shows a method for fabricating a heat sink in accordance with another embodiment.

FIG. 3 shows a method 300 for fabricating a heat sink in accordance with another embodiment.

As shown in 302, a carbon fiber fabric may be provided. The carbon fiber fabric may have a plurality of carbon fibers and a plurality of openings located at cross-points of the fabric. The carbon fiber fabric may further be configured in accordance with one or more embodiments described herein.

As shown in 304, metal (e.g. copper) may be deposited electrolytically onto the carbon fibers to form a carbon metal composite (e.g. carbon copper composite). The metal may be deposited such that at least some of the plurality of openings remain at least partially free from metal and form at least one contiguous path leading from a first side to a second side of the carbon copper composite. The carbon metal composite may further be configured in accordance with one or more embodiments described herein.

As shown in 306, the carbon metal composite may be placed adjacent to a semiconductor element with the first side of the carbon metal composite facing the semiconductor element.

As shown in 308, the at least one contiguous path may be filled electrolytically with metal (e.g. copper) to attach (in other words, bond) the carbon metal composite (e.g. carbon copper composite) to the semiconductor element.

In accordance with one or more embodiments, one or more (e.g. all) of the carbon fibers may include graphite. In accordance with another embodiment, the semiconductor element may include or may be a chip, e.g. a silicon chip, or a wafer, e.g. a silicon wafer. The semiconductor element, e.g. chip or wafer, may contain or consist of other semiconductor materials, including compound semiconductors, in accordance with other embodiments. The semiconductor element may further be configured in accordance with one or more embodiments described herein.

In accordance with another embodiment, the carbon metal composite may be placed adjacent to a back side surface of the chip or wafer with the first side of the carbon metal composite facing the back side surface of the chip or wafer.

In accordance with another embodiment, depositing the metal (e.g. copper) onto the carbon fibers may be carried out in such a manner that, after the deposition, a diameter of the openings is smaller at (or near) the first side of the carbon metal composite than at (or near) the second side of the carbon metal composite.

Illustratively, the carbon fiber fabric may be plated asymmetrically with metal (e.g. copper). In other words, deposition of metal (e.g. copper) may occur with a higher rate at one side of the fabric compared to another side of the fabric. This may, for example, be achieved by establishing a diffusion-controlled plating process, for example using a short distance between workpiece (i.e. carbon fiber fabric) and anode, and a relatively diluted electrolyte.

In accordance with another embodiment, the carbon metal composite (e.g. carbon copper composite) may be sintered before placing the carbon copper composite adjacent to the semiconductor element.

In accordance with another embodiment, filling the at least one contiguous path includes filling a first portion of the openings with metal (e.g. copper), and the semiconductor element and the carbon metal composite (e.g. carbon copper composite) may be soldered to a carrier (e.g. a lead frame), wherein a remaining portion of the openings is filled with soldering metal (e.g. tin).

Figure 4:
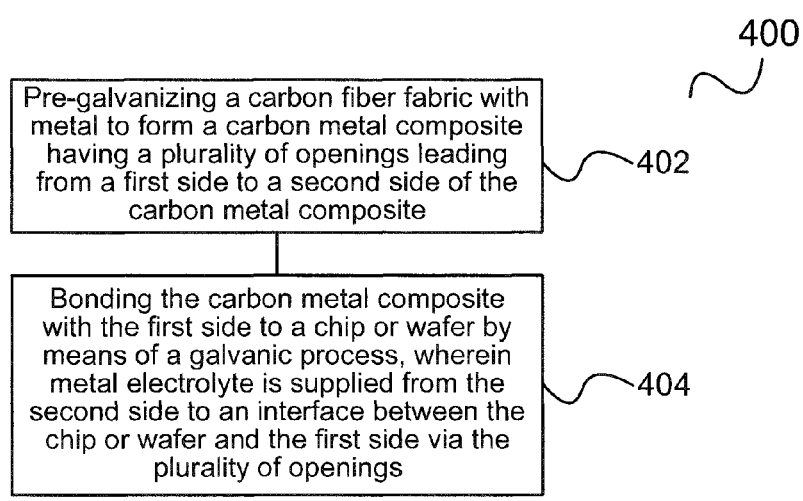
FIG. 4 shows a method for fabricating a heat sink in accordance with another embodiment.

FIG. 4 shows a method 400 for fabricating a heat sink in accordance with another embodiment.

As shown in 402, a carbon fiber fabric may be pregalvanized with metal (e.g. copper) to form a carbon metal composite (e.g. carbon copper composite) having a plurality of openings leading from a first side of the carbon metal composite to a second side of the carbon metal composite. The carbon fiber fabric and/or the carbon metal composite may further be configured in accordance with one or more embodiments described herein.

As shown in 404, the carbon metal composite (e.g. carbon copper composite) may be bonded with the first side to a chip or wafer by means of a galvanic process, wherein metal electrolyte (e.g. copper electrolyte) is supplied from the second side to an interface between the chip or wafer and the first side via the plurality of openings. The galvanic process may, for example, be carried out in accordance with one or more embodiments described herein.

In accordance with an embodiment, pre-galvanizing the carbon fiber fabric may be carried out such that the openings of the carbon metal composite have a smaller diameter at the first side of the carbon metal composite than at the second side of the carbon metal composite.

Figure 5:
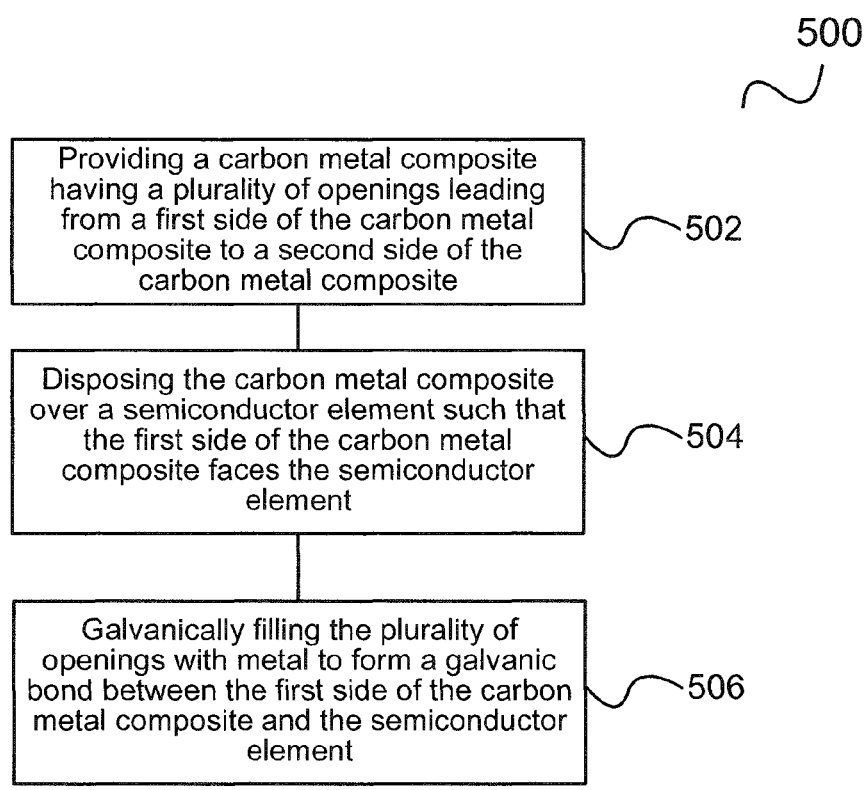
FIG. 5 shows a method for fabricating a heat sink in accordance with another embodiment.

FIG. 5 shows a method 500 for fabricating a heat sink in accordance with another embodiment.

As shown in 502, a carbon copper composite (e.g. carbon copper composite) may be provided, the carbon metal composite having a plurality of openings leading from a first side of the carbon metal composite to a second side of the carbon metal composite. The carbon metal composite may, for example, further be configured in accordance with one or more embodiments described herein.

As shown in 504, the carbon metal composite may be disposed over a semiconductor element such that the first side of the carbon metal composite faces the semiconductor element. The semiconductor element may, for example, be configured in accordance with one or more embodiments described herein.

As shown in 506, the plurality of openings may be filled galvanically with metal (e.g. copper) to form a galvanic bond between the first side of the carbon metal composite and the semiconductor element. Galvanic filling of the openings may, for example, be carried out in accordance with one or more embodiments described herein.

Figure 6A:
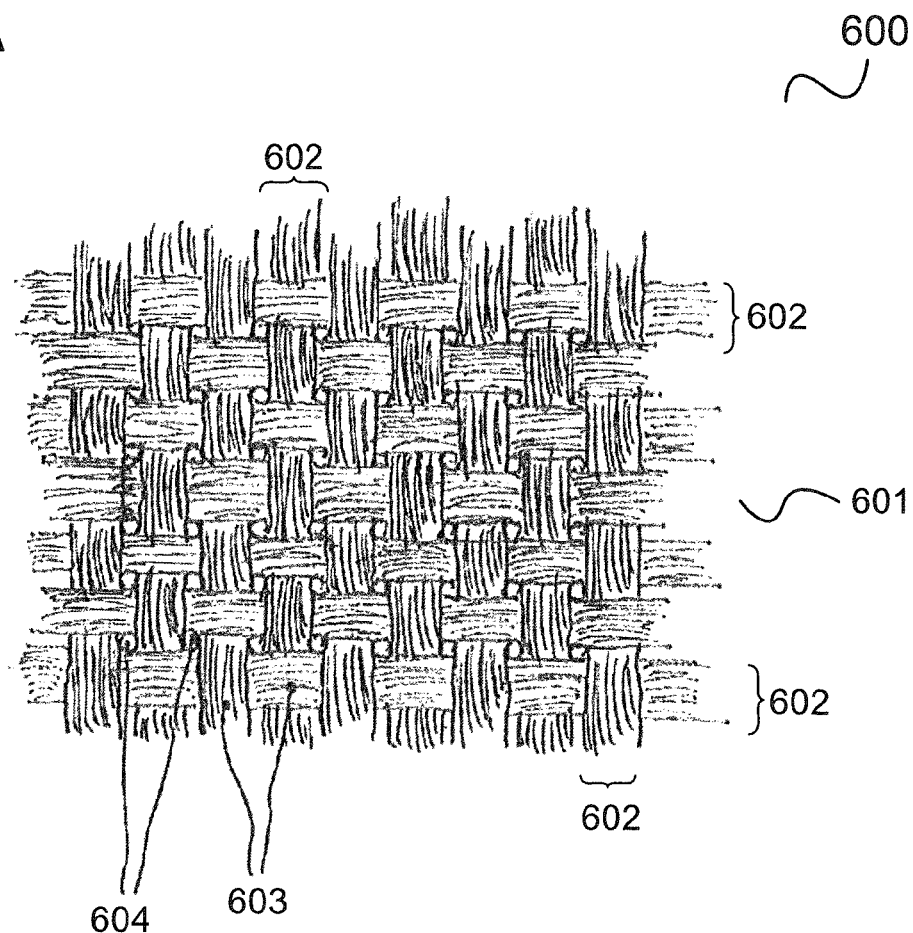
FIG. 6A and FIG. 6B show a heat sink in accordance with another embodiment.
Figure 6B:
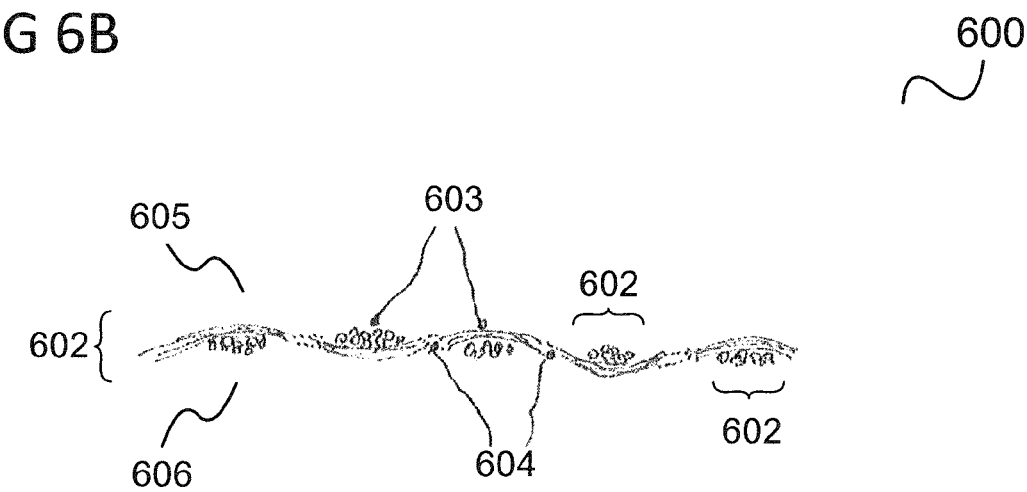

FIG. 6A and FIG. 6B show a heat sink 600 in accordance with another embodiment. FIG. 6A is a plan views and FIG. 6B is a cross-sectional view of a section of the heat sink 600.

The heat sink 600 may include a prefabricated CCu fabric 601 (herein also referred to as carbon copper composite, or as semifinished product or semifinished material), as shown.

The fabric 601 may have a plurality of carbon fiber bundles 602. The carbon fiber bundles 602 may cross each other, as shown. The number of carbon fiber bundles 602 may be arbitrary, in general.

Each bundle 602 may have a plurality of carbon fibers 603. The number of carbon fibers 603 per bundle 602 may be the same for all bundles 602, or may be different. In accordance with one or more embodiments, one or more (e.g. all) of the carbon fibers may include graphite.

The carbon fibers 603 may, for example, have a length and/or diameter in accordance with one or more embodiments described herein.

The carbon fibers 603 may have been electroplated with copper, for example in accordance with one or more embodiments described herein. In other words, the carbon fibers 603 may have been coated with copper. In still other words, the fabric 601 may have been pregalvanized with copper.

In accordance with some embodiments, the fabric 601 may have been sintered after electroplating the carbon fibers 603 with copper.

The fabric 601 may further have a plurality of openings 604 (herein also referred to as voids), as shown.

In accordance with some embodiments, the openings 604 may be located at cross-points of the fabric 601.

The openings 604 (or at least some of the openings) may lead from a first side 605 of the fabric 601 to a second side 606 of the fabric 601, as shown in FIG. 6B. The first side 605 and the second side 606 may be opposite sides of the fabric 601, as shown in FIG. 6B. The first side 605 may, for example, be an upper side (or lower side) of the fabric 601, and the second side 606 may, for example, be a lower side (or upper side) of the fabric 601, as shown in FIG. 6B.

In accordance with some embodiments, the heat sink 600 may be attached or bonded to a semiconductor element (for example, to a chip or wafer, e.g. to a back side of a silicon chip or wafer) by means of an electrolytic process (herein also referred to as galvanic bonding). In this context, electrolyte may access an interface between the semiconductor element (e.g. a chip or wafer back side) and the semifinished product (i.e. the pregalvanized fabric 601) via the plurality of openings 604. In other words, the electrolyte may reach the interface between the semiconductor element and the fabric 601 through the openings 604 via at least one contiguous path formed by the openings 604.

In accordance with some embodiments, the openings 604 may be narrower at the first side 605 of the fabric 601 than at the second side 606 of the fabric 601. In other words, a diameter of the openings 604 may be smaller at (or near) the first side 605 of the fabric 601 than at (or near) the second side 606 of the fabric 601. In accordance with some embodiments, this may, for example, have been achieved by an asymmetric pre-galvanization of the carbon fibers 603 with copper, during which copper may have been deposited with a higher rate at the first side 605 than at the second side 606 of the fabric 601.

Illustratively, FIG. 6A and FIG. 6B show a heat sink 600 having a plurality of carbon fibers 603 arranged in bundles 602 to form a fabric 601 and pre-galvanized with copper, and a plurality of openings 604 remaining between the pre-galvanized bundles 602 (e.g. at cross-points of the fabric 601). The openings 604 may have the effect that, when the heat sink 600 is galvanically bonded to a semiconductor element (e.g. chip or wafer), electrolyte may advance (in other words, pass) to all locations of an interface between the semiconductor element and the heat sink 600, for example in periodic and/or smallest possible distances. Illustratively, the plurality of openings 604 may serve as a plurality of contact locations where electrolyte may contact the interface between the heat sink 600 and the semiconductor element. FIG. 6A and FIG. 6B show an example of a heat sink including a carbon fiber fabric pre-galvanized with copper. In accordance with other embodiments, carbon fiber fabrics described herein may be pre-galvanized with a metal or metals other than copper, for example, gold, silver, or others.

A method for fabricating a heat sink in accordance with some embodiments may include galvanically bonding a pre-galvanized carbon fiber fabric to a surface of a substrate wafer. The surface may, for example, be a nickel-plated surface. The wafer may, for example, have a thickness in the micrometer range, for example a thickness of a few hundred micrometers, e.g. about 120 μm, alternatively the thickness may have different values. Galvanically bonding the carbon fiber fabric to the wafer may, for example, include holding the fabric mechanically in position over the wafer surface and using a copper electrolyte. The galvanic bonding may, for example, be realized using a normal sulfuric acid copper electrolyte and a pulsed galvanic deposition, for example with a pulse frequency of several hundred hertz (Hz), for example with a frequency of about 700 Hz. In an example, an edge portion of the wafer (for example, an approximately 1 cm wide edge of the wafer) may remain uncovered for reasons of masking technology of the wafer, so that the wafer may be electrically connected on the other side.

In the following, various aspects and potential effects of various embodiments are described.

In accordance with various embodiments, a heat sink including or being made of a carbon fiber metal composite, for example a carbon fiber copper composite (CCu) according to some embodiments, may be galvanically bonded to a semiconductor element, for example to a chip or wafer, e.g. to a back side of a chip or wafer.

In a conventional method, a whole Cu block is galvanically bonded as a heat sink to a chip. In this method, starting from the center of the block, a gap, which becomes increasingly wider, may be provided in order to avoid that edge regions will be overgrown and large voids remain in the center during the galvanic bonding. The tolerance with respect to the geometry of the gap, e.g. with respect to the precision of the angle, may be very narrow though.

In accordance with various embodiments described herein, the aforementioned problem of the conventional method may be avoided or substantially reduced by using a semifinished heat sink of a carbon fiber metal composite, e.g. CCu (carbon fiber copper composite). The semifinished CCu heat sink may have a large density of openings (or voids) linked to one another, through which everywhere—once the semifinished heat sink has been placed on a surface of a semiconductor element (e.g. on the silicon surface of a silicon chip or wafer)—electrolyte may reach the interface between the semiconductor element (e.g. silicon chip or wafer) and the semifinished product.

According to various embodiments, fabricating the semifinished CCu heat sink may include pre-galvanizing a carbon fiber fabric, for example a carbon fiber fabric as is e.g. used in aircraft construction. Thus, portions of the fabric where the carbon fibers (e.g. fibers of a fiber bundle) lie very close to one another may be galvanically linked to one another, while openings or voids may still remain at cross-points of the fabric. In order to make the difference between the galvanically linked carbon fibers (or bundles of carbon fibers) and the cross-points even stronger in terms of remaining voids, remaining microscopic voids may be sealed by means of sintering (hot pressing), while the rather macroscopic voids (openings) at the cross-points of the carbon fiber fabric may remain for the further processing. It may be exactly these (macroscopic) voids, through which electrolyte may reach the interface between the pre-galvanized heat sink and the rearward wafer surface. If now the wafer is electrically connected on the other side, the remaining voids (openings) may be backfilled galvanically with copper (also referred to as galvanic backfilling of the voids or openings), wherein copper growth may start at the interface "heat sink—wafer". In other words, parts of the openings that are closer to the interface may be filled earlier than parts of the openings that are farther away.

In order to avoid that the electrolyte-sided openings will be overgrown (in other words, sealed) at an early stage during the galvanic backfilling, the carbon fiber fabric may be pre-galvanized such that more copper is grown on one side of the fabric than on the other side in accordance with some embodiments. In other words, the carbon fiber fabric may be pre-galvanized with an asymmetric copper-plating rate. This may, for example, be achieved by establishing a diffusion-controlled process by using a short distance between workpiece and anode (i.e. between heat sink and wafer) and a relatively diluted electrolyte.

In accordance with some embodiments, the galvanic backfilling may be carried out such that the openings are only partially filled with copper. In other words, it may be possible that one or more openings remain after the galvanic bonding of the heat sink to the wafer. The remaining openings may, for example, be filled with solder (e.g. tin) during soldering the semiconductor element (e.g. chip) to a carrier (e.g. lead frame), e.g. using a vacuum soldering process.

In accordance with various embodiments, a heat sink for ultrathin wafers or chips (e.g. ultrathin silicon wafers or chips) may be fabricated by means of galvanically bonding a semifinished product made of a carbon fiber copper composite material to a rearward wafer surface by means of galvanically backfilling a plurality of openings in the semifinished product. In accordance with some embodiments, the semifinished product may be asymmetrically pre-galvanized to keep the size of openings, which may remain after the galvanic bonding process, as small as possible. In accordance with some embodiments, the galvanic bonding of the semifinished product may be partial (in other words, incomplete), and remaining openings or voids, which may be linked everywhere, may be filled with solder (e.g. tin) in a soldering process (e.g. vacuum soldering process) when soldering the chip (including its heat sink).

In accordance with various embodiments, the use of metallic solder barriers (whose thermal properties may impede the propagation of a heat pulse) at the transition between ultrathin silicon and a heat sink may be avoided.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for fabricating a heat sink, comprising:
providing a carbon metal composite having a plurality of metal-coated carbon fibers and a plurality of openings, the openings leading from a first side of the carbon metal composite to a second side of the carbon metal composite;
disposing the carbon metal composite over a semiconductor element such that the first side of the carbon metal composite faces the semiconductor element; and
bonding the carbon metal composite to the semiconductor element by means of an electroplating process, wherein metal electrolyte is supplied to an interface between the first side of the carbon metal composite and the semiconductor element via the plurality of openings.

2. The method of claim 1,
wherein the carbon metal composite comprises a carbon copper composite and the plurality of metal-coated carbon fibers comprises a plurality of copper-coated carbon fibers; and
wherein the metal electrolyte comprises a copper electrolyte.

3. The method of claim 2,
wherein providing the carbon copper composite comprises:
providing a carbon fiber fabric having a plurality of carbon fibers and a plurality of carbon fiber fabric openings, the carbon fiber fabric openings leading from a first side of the carbon fiber fabric to a second side of the carbon fiber fabric;
electroplating the carbon fiber fabric with a copper so as to form the carbon copper composite, wherein the first side of carbon copper composite comprises the first side of the carbon fiber fabric, the second side of the carbon copper composite comprises the second side of the carbon fiber fabric, and the openings comprise the carbon fiber fabric openings.

4. The method of claim 3,
wherein providing the carbon copper composite further comprises: electroplating the carbon fiber fabric with a metal that forms at least one common phase with carbon and at least one common phase with copper; and
annealing the carbon fiber fabric and the metal after electroplating the carbon fiber fabric with the metal and before electroplating the carbon fiber fabric with the copper.

5. The method of claim 3,
wherein providing the carbon copper composite further comprises:
electroplating the carbon fiber fabric with a first metal layer comprising a metal that forms at least one common phase with carbon and at least one common phase with nickel;
electroplating the carbon fiber fabric with a second metal layer after electroplating the carbon fiber fabric with the first metal layer, the second metal layer comprising nickel; and
annealing the carbon fiber fabric, the first metal layer and the second metal layer after electroplating the carbon fiber fabric with the second metal layer and before electroplating the carbon fiber fabric with the copper.

6. The method of claim 1,
wherein the openings are narrower at the first side of the carbon metal composite than at the second side of the carbon metal composite.

7. The method of claim 1,
wherein providing the carbon metal composite comprises:
providing a carbon fiber fabric having a plurality of carbon fibers and a plurality of carbon fiber fabric openings, the carbon fiber fabric openings leading from a first side of the carbon fiber fabric to a second side of the carbon fiber fabric;
electroplating the carbon fiber fabric with a metal so as to form the carbon metal composite, wherein the first side of the carbon metal composite comprises the first side of the carbon fiber fabric, the second side of the carbon metal composite comprises the second side of the carbon fiber fabric, and the openings comprise the carbon fiber fabric openings.

8. The method of claim 7,
wherein the carbon fiber fabric openings are located at cross-points of the carbon fiber fabric.

9. The method of claim 7,
wherein electroplating the carbon fiber fabric with the metal further comprises depositing the metal at a higher rate at the first side of the carbon fiber fabric than at the second side of the carbon fiber fabric.

10. The method of claim 7, wherein providing the carbon metal composite further comprises:
sintering the carbon fiber fabric after electroplating the carbon fiber fabric with the metal.

11. The method of claim 1,
wherein the semiconductor element comprises a chip or wafer.

12. The method of claim 1,
wherein bonding the carbon metal composite to the semiconductor element comprises filling a first portion of the plurality of openings with metal, the method further comprising:
soldering the semiconductor element and the carbon metal composite to a carrier after bonding the carbon metal composite to the semiconductor element, such that a remaining portion of the plurality of openings is filled with soldering metal.

* * * * *